US007812434B2

(12) United States Patent
Yang

(10) Patent No.: US 7,812,434 B2
(45) Date of Patent: Oct. 12, 2010

(54) WAFER LEVEL PACKAGE WITH DIE RECEIVING THROUGH-HOLE AND METHOD OF THE SAME

(75) Inventor: Wen-Kun Yang, Hsin-Chu (TW)

(73) Assignee: Advanced Chip Engineering Technology Inc, Hsinchu County (TW)

( * ) Notice: Subject to any disclaimer, the term of this patent is extended or adjusted under 35 U.S.C. 154(b) by 762 days.

(21) Appl. No.: 11/648,787

(22) Filed: Jan. 3, 2007

(65) Prior Publication Data

US 2008/0157396 A1    Jul. 3, 2008

(51) Int. Cl.
*H01L 23/06* (2006.01)
(52) U.S. Cl. ............... 257/684; 257/700; 257/690
(58) Field of Classification Search .......... 257/678–733
See application file for complete search history.

(56) References Cited

U.S. PATENT DOCUMENTS 6,127,634 A * 10/2000 Higashiguchi et al. ...... 174/262
6,952,049 B1 * 10/2005 Ogawa et al. ............... 257/700
7,459,729 B2 * 12/2008 Yang et al. .................. 257/99
2008/0083980 A1 * 4/2008 Yang et al. .................. 257/700
2008/0116564 A1 * 5/2008 Yang et al. .................. 257/698
2008/0136002 A1 * 6/2008 Yang .......................... 257/686
2008/0157341 A1 * 7/2008 Yang et al. .................. 257/700

* cited by examiner

*Primary Examiner*—Zandra Smith
*Assistant Examiner*—Telly D Green
(74) *Attorney, Agent, or Firm*—Muncy, Geissler, Olds & Lowe, PLLC

(57) ABSTRACT

The present invention discloses a structure of package comprising: a substrate with a die receiving through hole; a base attached on a lower surface of the substrate; a die disposed within the die receiving through hole and attached on the base; a dielectric layer formed on the die and the substrate; a re-distribution layer (RDL) formed on the dielectric layer and coupled to the die; a protection layer formed over the RDL; and pluralities of pads formed on the protection layer and coupled to the RDL. The RDL is made from an alloy comprising Ti/Cu/Au alloy or Ti/Cu/Ni/Au alloy.

9 Claims, 3 Drawing Sheets

WAFER LEVEL PACKAGE WITH DIE RECEIVING THROUGH-HOLE AND METHOD OF THE SAME

FIELD OF THE INVENTION

This invention relates to a structure of wafer level package (WLP), and more particularly to a fan-out wafer level package with die receiving through-hole of substrate to improve the reliability and to reduce the device size.

DESCRIPTION OF THE PRIOR ART

In the field of semiconductor devices, the device density is increased and the device dimension is reduced, continuously. The demand for the packaging or interconnecting techniques in such high density devices is also increased to fit the situation mentioned above. Conventionally, in the flip-chip attachment method, an array of solder bumps is formed on the surface of the die. The formation of the solder bumps may be carried out by using a solder composite material through a solder mask for producing a desired pattern of solder bumps. The function of chip package includes power distribution, signal distribution, heat dissipation, protection and support . . . and so on. As a semiconductor become more complicated, the traditional package technique, for example lead frame package, flex package, rigid package technique, can't meet the demand of producing smaller chip with high density elements on the chip.

Furthermore, because conventional package technologies have to divide a dice on a wafer into respective dies and then package the die respectively, therefore, these techniques are time consuming for manufacturing process. Since the chip package technique is highly influenced by the development of integrated circuits, therefore, as the size of electronics has become demanding, so does the package technique. For the reasons mentioned above, the trend of package technique is toward ball grid array (BGA), flip chip (FC-BGA), chip scale package (CSP), Wafer level package (WLP) today. "Wafer level package" is to be understood as meaning that the entire packaging and all the interconnections on the wafer as well as other processing steps are carried out before the singulation (dicing) into chips (dies). Generally, after completion of all assembling processes or packaging processes, individual semiconductor packages are separated from a wafer having a plurality of semiconductor dies. The wafer level package has extremely small dimensions combined with extremely good electrical properties.

WLP technique is an advanced packaging technology, by which the die are manufactured and tested on the wafer, and then singulated by dicing for assembly in a surface-mount line. Because the wafer level package technique utilizes the whole wafer as one object, not utilizing a single chip or die, therefore, before performing a scribing process, packaging and testing has been accomplished; furthermore, WLP is such an advanced technique so that the process of wire bonding, die mount and under-fill can be omitted. By utilizing WLP technique, the cost and manufacturing time can be reduced, and the resulting structure of WLP can be equal to the die; therefore, this technique can meet the demands of miniaturization of electronic devices.

Though the advantages of WLP technique mentioned above, some issues still exist influencing the acceptance of WLP technique. For instance, the CTE difference (mismatching) between the materials of a structure of WLP and the mother board (PCB) becomes another critical factor to mechanical instability of the structure. A package scheme disclosed by Patent Number U.S. Pat. No. 6,271,469 suffers the CTE mismatching issue. It is because the prior art uses silicon die encapsulated by molding compound. As known, the CTE of silicon material is 2.3, but the CTE of molding compound is around 40-80. The arrangement causes chip location be shifted during process due to the curing temperature of compound and dielectric layers materials are higher and the inter-connecting pads will be shifted that will causes yield and performance problem. It is difficult to return the original location during temperature cycling (it caused by the epoxy resin property if the curing Temp near/over the Tg). It means that the prior structure package can not be processed by large size, and it causes higher manufacturing cost.

Further, some technical involves the usage of die that directly formed on the upper surface of the substrate. As known, the pads of the semiconductor die will be redistributed through redistribution processes involving a redistribution layer (RDL) into a plurality of metal pads in an area array type. The build up layer will increase the size of the package. Therefore, the thickness of the package is increased. This may conflict with the demand of reducing the size of a chip.

Further, the prior art suffers complicated process to form the "Panel" type package. It needs the mold tool for encapsulation and the injection of mold material. It is unlikely to control the surface of die and compound at same level due to warp after heat curing the compound, the CMP process may be needed to polish the uneven surface. The cost is therefore increased.

Therefore, the present invention provides a fan-out wafer level packaging (FO-WLP) structure with good CTE performance and shrinkage size to overcome the aforementioned problem and also provide the better board level reliability test of temperature cycling.

SUMMARY OF THE INVENTION

The object of the present invention is to provide a fan-out WLP with excellent CTE performance and shrinkage size.

The further object of the present invention is to provide a fan-out WLP with a substrate having die receiving through-hole for improving the reliability and shrinking the device size.

The present invention discloses a structure of package comprising: a substrate with a die receiving through hole; a base attached on a lower surface of the substrate; a die disposed within the die receiving through hole of substrate and attached (by die attached materials) on the base; an elastic core paste materials filling into the space between die edge and side wall of die receiving through hole of said substrate; a dielectric layer formed on the active surface of said die and the substrate; a redistribution layer (RDL) formed on the dielectric layer and coupled to the die; a protection layer formed over the RDL; and pluralities of terminal pads formed on the protection layer and coupled to the RDL. The RDL is made from an alloy comprising Ti/Cu/Au alloy or Ti/Cu/Ni/Au alloy.

The material of the substrate includes epoxy type FR5, FR4, BT, silicon, PCB (print circuit board) material, glass or ceramic. Alternatively, the material of the substrate includes alloy or metal. Preferably, the CTE (Coefficient of Thermal Expansion) of the substrate is close to the CTE of the mother board (PCB) which has CTE around 16 to 20. A cover layer is formed under the base. The material of the dielectric layer includes an elastic dielectric layer, a photosensitive layer, a silicone dielectric based layer, a siloxane polymer (SINR) layer, a polyimides (PI) layer or silicone resin layer. The material of the base includes Alloy42 (42% Ni-58% Fe) or Kovar (29% Ni-17% Co-54% Fe) or silicon, glass, ceramic. Preferably, the CTE of the base is close to the CTE of silicon die (CTE is around 3) to avoid the CTE mismatching issue that raises the yield and process problem.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENT

The invention will now be described in greater detail with preferred embodiments of the invention and illustrations attached. Nevertheless, it should be recognized that the preferred embodiments of the invention is only for illustrating. Besides the preferred embodiment mentioned here, present invention can be practiced in a wide range of other embodiments besides those explicitly described, and the scope of the present invention is expressly not limited expect as specified in the accompanying Claims.

The present invention discloses a structure of fan-out WLP utilizing a substrate having predetermined terminal contact metal pads 3 formed thereon and a pre-formed through hole 4 formed into the substrate 2. A die is disposed within the die receiving through hole of the substrate and attached on the base (by die attached materials), an elastic core paste material is filled into the space between die edge and side wall of die receiving through hole of said substrate. A photosensitive material is coated over the die and the pre-formed substrate (includes the core paste area). Preferably, the material of the photosensitive material is formed of elastic material.

Figure 1:
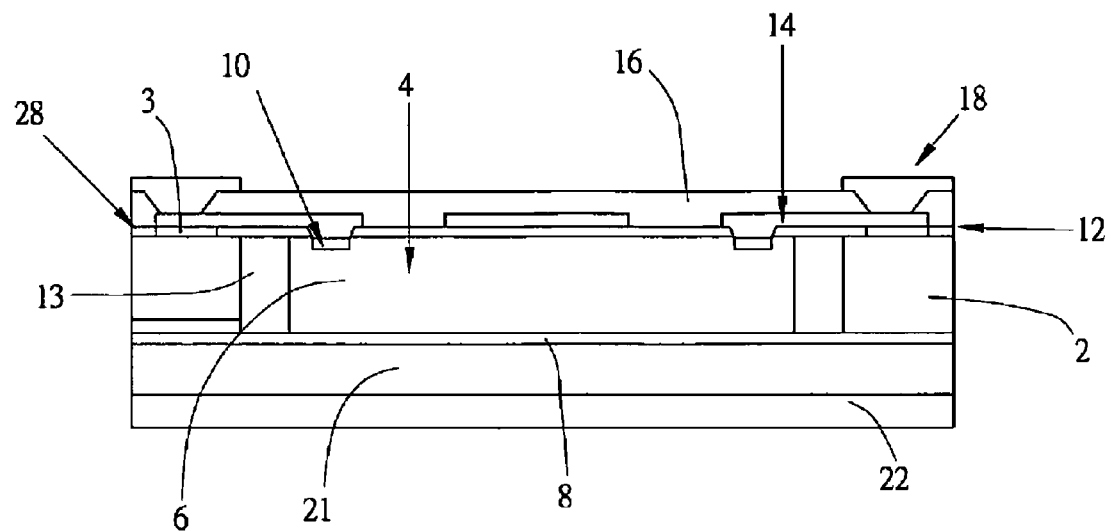
FIG. 1 illustrates a cross-sectional view of a structure of fan-out WLP according to the present invention. (LGA type)

FIG. 1 illustrates a cross-sectional view of Fan-Out Wafer Level Package (FO-WLP) in accordance with one embodiment of the present invention. As shown in the FIG. 1, the structure of FO-WLP includes a substrate 2 having a terminal contact metal pads 3 (for organic substrate) and die receiving through holes 4 formed therein to receive a die 6. The through hole 4 is formed from the upper surface of the substrate through the substrate to the lower surface. The through hole 4 is pre-formed within the substrate 2. A (silicon, glass, ceramic, metal or alloy) base 21 is attached on the lower surface of the substrate 2, thereby attaching the die 6 on the base 21 by die adhesion material 8 including elastic type or silver epoxy type material for better thermal conductivity. A cover 22 is formed under the lower surface of the glass or alloy base 21 for laser mark or protection. The material includes epoxy.

The die 6 is disposed within the die receiving through holes 4 on the substrate 2 and fixed by the die adhesion material 8. As know, contact pads (Bonding pads) 10 are formed on the die 6. A photosensitive layer or dielectric layer 12 is formed over the die 6 and the upper surface of substrate and core paste 13 is filled within the space between the die 6 and the sidewalls of the through holes 4. Pluralities of openings are formed within the dielectric layer 12 through the lithography process or exposure and develop procedure. The pluralities of openings are aligned to the contact pads or I/O pads 10 and terminal contact metal pads 3 on the substrate, respectively. The RDL (redistribution layer) 14, also referred to as conductive trace 14, is formed on the dielectric layer 12 by removing (seed layers) selected portions of metal layer formed over the layer 12, wherein the RDL 14 keeps electrically connected with the die 6 through the I/O pads 10 and terminal contact metal pads 3. A part of the material of the RDL will re-fills into the openings in the dielectric layer 12. A protection layer 16 is formed to cover the RDL 14. Terminal pads 18 are located on the protection layer 16 and connected to the RDL 14 and contact metal pads 3 of the substrate. A scribe line 28 is defined between the package units for separating each unit, any maybe there is no dielectric layer (optional).

Figure 3:
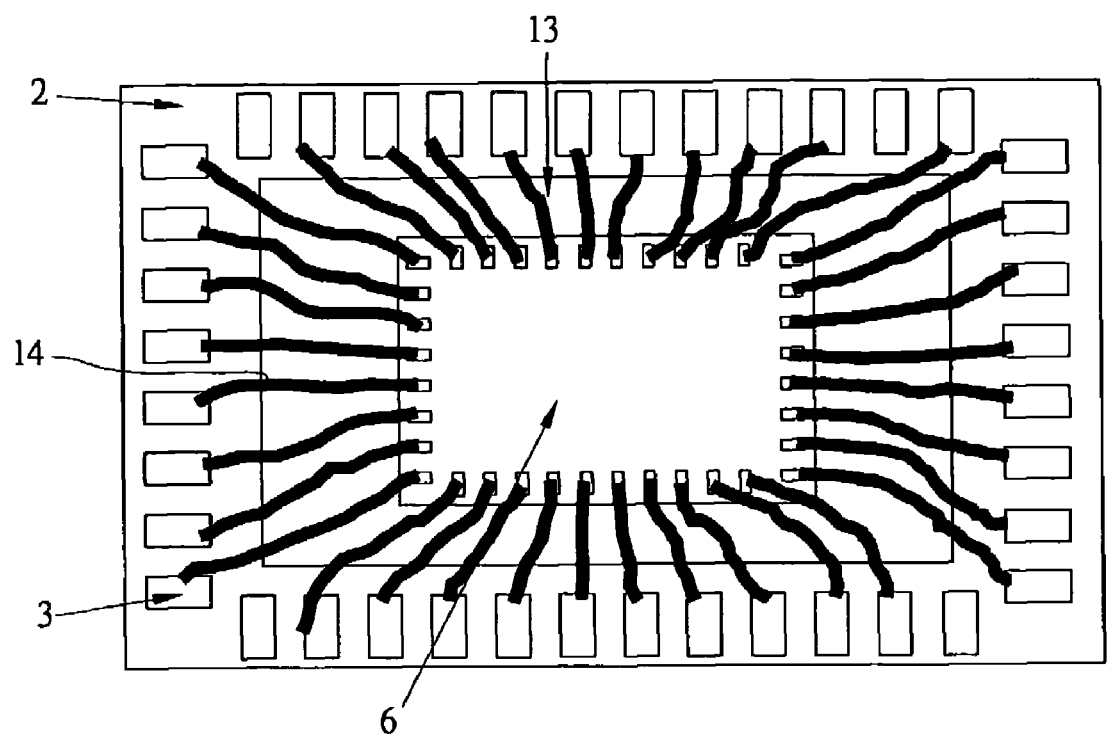
FIG. 3 illustrates a top view of a structure of fan-out WLP according to the present invention. (LGA peripheral type)

The dielectric layer 12 is formed atop of the die 6 and substrate 2 and elastic core paste area, it acts as buffer area that absorbs the thermal mechanical stress between the die 6 and substrate 2 during temperature cycling due to the dielectric layer 12 is elastic property. The aforementioned structure constructs LGA type package. The pads 3 may be formed within the dielectric layer 12, over the substrate 2 and maybe aligned to the terminal pad 18. FIG. 3 illustrate the top view of the LGA type.

Figure 2:
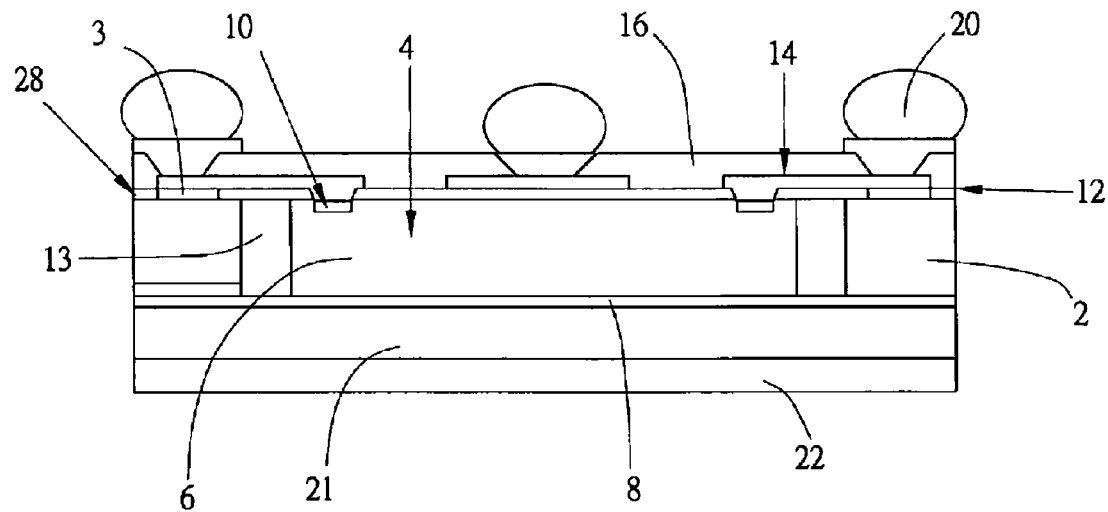
FIG. 2 illustrates a cross-sectional view of a structure of fan-out WLP according to the present invention. (BGA type)

An alternative embodiment can be seen in FIG. 2, conductive balls 20 are formed on the terminal pads 18. This type is called BGA type. The other parts are similar to FIG. 1, therefore, the detailed description is omitted. The terminal pads 18 act as the UBM (under ball metal) under the BGA scheme in the case. Pluralities of contact conductive pads 3 are formed on the upper surface of the substrate 2 and under the RDL 14.

Preferably, the material of the substrate 2 is organic substrate likes epoxy type FR5, BT, FR4 CCL (copper clad laminate). PCB with defined through holes or Cu metal with pre etching circuit. Preferably, the CTE is the same as the one of the mother board (PCB). Preferably, the organic substrate with high Glass transition temperature (Tg) are epoxy type FR5, FR4, CCL or BT (Bismaleimide triazine) type substrate. The Cu metal (CTE around 16) can be used also. The glass, ceramic, silicon can be used as the substrate. Further, the (metal, silicon, glass, ceramic or alloy) base 21 is preferably formed of Alloy42 due to the CTE of the material matches to the silicon die and it has the properties of non-brittle and it is likely to be formed with thinner thickness. The elastic core paste is formed of silicone rubber elastic materials, it maybe the same with the die attached materials. Furthermore, the die attaching material 8 is formed of elastic type or silver epoxy type material for better thermal conductivity.

It is because that the CTE (X/Y direction) of the epoxy type organic substrate (FR5/BT) is around 16 and the CTE of the tool for chip redistribution is around 5 to 8 by employing the glass materials as the tool. The FR5/BT is unlikely to return to original location after the temperature cycling (the temperature is close to Glass transition temperature Tg) that causes the die shift in panel form during the WLP process which needs several high temperature process. For example, the dielectric layers formation, the heat curing die attached materials etc., once the base is attached on the die back side and substrate with die redistribution tool together; the base is used to make sure organic substrate can keep the die at the original location and no any warp occurs during process.

Figure 4:
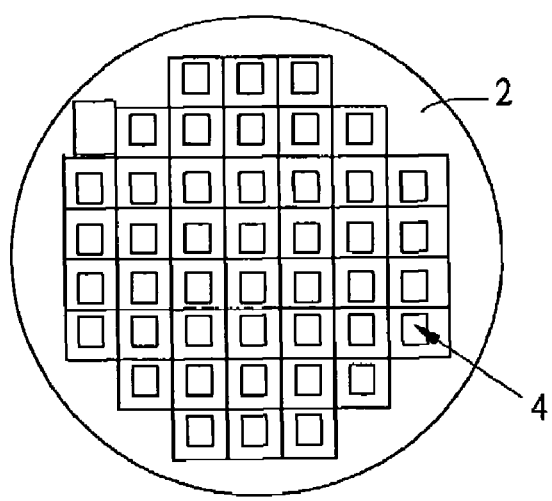
FIG. 4 illustrates a top view of the substrate with pre-formed through holes according to the present invention.

The substrate could be round type such as wafer type, the diameter could be 200, 300 mm or higher. It could be employed for rectangular type such as panel form. The substrate 2 is pre-formed with die receiving through holes 4. The scribe line 28 is defined between the units for separating each unit. Please refer to FIG. 4, it shows that the substrate 2 includes a plurality of pre-formed die receiving through hole 4 arranged in a matrix form.

In one embodiment of the present invention, the dielectric layer 12 is preferably an elastic dielectric material which is made by silicone dielectric based materials comprising siloxane polymers (SINR), Dow Corning WL5000 series, and the combination thereof. In another embodiment, the dielectric layer is made by a material comprising, polyimides (PI) or silicone resin. Preferably, it is a photosensitive layer for simple process.

In one embodiment of the present invention, the elastic dielectric layer is a kind of material with CTE larger than 100 (ppm/° C.), elongation rate about 40 percent (preferably 30 percent-50 percent), and the hardness of the material is between plastic and rubber. The thickness of the elastic dielectric layer 18 depends on the stress accumulated in the RDL/dielectric layer interface during temperature cycling test.

Figure 5:
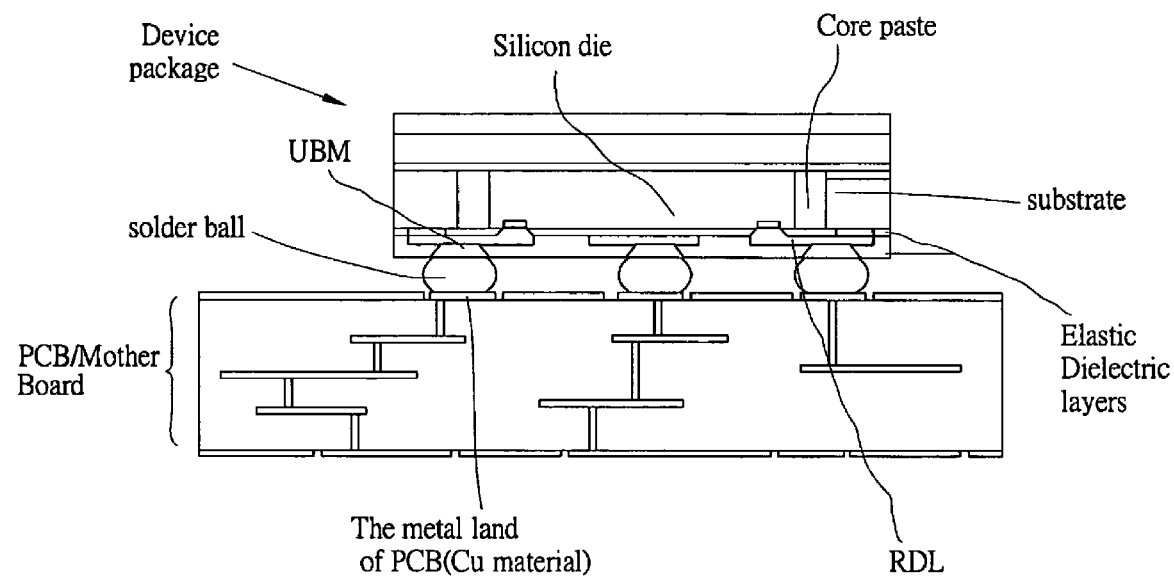
FIG. 5 illustrates a view of the semiconductor device Package on board level temperature cycling test according to the present invention.

Please refer to FIG. 5, it illustrates the major portions that associate with the CTE issue. The silicon die (CTE is ~2.3) is packaged inside the package. FR5 or BT organic epoxy type material (CTE~16) is employed as the substrate and its CTE is the same as the PCB or Mother Board. The space (gap) between the die and the substrate is filled with filling material (prefer the elastic core paste) to absorb the thermal mechanical stress due to CTE mismatching (between die and the epoxy type FR5/BT). Further, the dielectric layers 12 include elastic materials to absorb the stress between the die pads and the PCB. The RDL metal is Cu/Au materials and the CTE is around 16 that is the same as the PCB and organic substrate, and the UBM 18 of contact bump be located on the terminal contact metal pads 3 of substrate. The metal land of PCB is Cu composition metal, the CTE of Cu is around 16 that is match to the one of PCB. From the description above, the present invention may provide excellent CTE (fully matching in X/Y direction) solution for the WLP.

Apparently, CTE matching issue under the build up layers (PCB and substrate) is solved by the present scheme and it provides better reliability (no thermal stress in X/Y directions for terminal pads (solder balls/bumps) on the substrate during on board level condition) and the elastic DL is employed to absorb the Z direction stress. The space (gap) between chip edge and sidewall of through holes of substrate can be used to fill the elastic dielectric materials to absorb the mechanical/thermal stress.

In one embodiment of the invention, the material of the RDL 24 comprises Ti/Cu/Au alloy or Ti/Cu/Ni/Au alloy; the thickness of the RDL 24 is between 2 um_and_15 um. The Ti/Cu alloy is formed by sputtering technique also as seed metal layers, and the Cu/Au or Cu/Ni/Au alloy is formed by electroplating; exploiting the electro-plating process to form the RDL can make the RDL thick enough and better mechanical properties to withstand CTE mismatching during temperature cycling. The metal pads 20 can be Al or Cu or combination thereof. If the structure of FO-WLP utilizes SINR as the elastic dielectric layer and Cu as the RDL, according the stress analysis not shown here, the stress accumulated in the RDL/dielectric layer interface is reduced.

As shown in FIG. 1-2, the RDL 24 fans out of the die and communicates toward the terminal pads 18. It is different from the prior art technology, the die 6 is received within the pre-formed die receiving through hole of the substrate, thereby reducing the thickness of the package. The prior art violates the rule to reduce the die package thickness. The package of the present invention will be thinner than the prior art. Further, the substrate is pre-prepared before package. The through hole 4 is pre-determined. Thus, the throughput will be improved than ever. The present invention discloses a fan-out WLP with reduced thickness and good CTE matching performance.

The present invention includes preparing a substrate (preferably organic substrate FR4/FR5/BT/CCL) and contact metal pads are formed on top surface and a metal base is formed on the lower surface. The through hole is formed with the size larger than die size plus > 100 um/side. The depth is the same with the thickness of dice thickness. The metal base is preferably Alloy42 due to low CTE (the CTE close to silicon die). The thickness is around 2 mils to 5 mils for thinner package application and it can be 200 mm or 300 mm round type or square type etc to fit the panel size.

The RDL (trace 1, optional process) is formed on the processed silicon wafer, it can improves the yield during process if the pitch of I/O metal (bonding) pads is too tight (small) for photo lithography process. The next step is lapping the wafer by back-lapping to desired thickness. The wafer is introduced to dicing procedure to separate the dice.

Thereafter, process for the present invention includes providing an die redistribution (alignment) tool with alignment pattern formed thereon. Then, the patterned glues is printed on the tool (be used for sticking the surface of dice), followed by using pick and place fine alignment system with flip chip function to redistribute the desired dies on the tool with desired pitch. The patterned glues will stick the chips (active surface side) on the tool. Subsequently, the substrate (with die receiving through holes) is bound on the tool and followed by printing elastic core paste material on the space (gap) between die and side walls of through holes of said (FR5/BT) substrate. Next, the die attaching material is printed on the lower surface of the substrate and the back side of the die. It can be the same materials for the core paste and die attached materials.

The panel bonder is used to bond the base on to the substrate and die back side. Vacuum curing is next performed, followed by separating the tool from the panel wafer.

Once the die is redistributed on the substrate (panel base), then, a clean up procedure is performed to clean the dice surface by wet and/or dry clean. Next step is to coat the dielectric materials on the surface of panel. Subsequently, lithography process is performed to open via (contact metal pads) and Al bonding pads and/or the scribe line (optional). Plasma clean step is then executed to clean the surface of via holes and Al bonding pads. Next step is to sputter Ti/Cu as seed metal layers, and then Photo Resistor (PR) is coated over the dielectric layer and seed metal layers for forming the patterns of redistributed metal layers (RDL). Then, the electro plating is processed to form Cu/Au or Cu/Ni/Au as the RDL metal, followed by stripping the PR and metal wet etching to form the RDL metal trace. Subsequently, the next step is to coat or print the top dielectric layer and to open the contact bump via to form the UBM and/or to open the scribe line (optional).

After the ball placement or solder paste printing, the heat re-flow procedure is performed to re-flow on the ball side (for BGA type). The epoxy is printed on back side of the base for forming top marking. The testing is executed. Panel wafer level final testing is performed by using vertical probe card. After the testing, the substrate is sawed to singular the package into individual units. Then, the packages are respectively picked and placed the package on the tray or tape and reel.

The advantages of the present inventions are:

The process is simple for forming Panel wafer type and is easy to control the roughness of panel surface. The thickness of panel (die attached) is easy to be controlled and die shift issue will be eliminated during process. The injection mold tool is omitted and warp, CMP polish process will not be introduced either. The panel wafer is easy to be processed by wafer level packaging process.

The substrate is pre-prepared with pre-form through holes and terminal contact metal pads (for organic substrate); the size of through hole is equal to die size plus around >100 um per/side; it can be used as stress buffer releasing area by filling the elastic core paste materials to absorb the thermal stress due to the CTE difference between silicon die and substrate (FR5/BT)). The packaging throughput will be increased (manufacturing cycle time was reduced) due to apply the simple build up layers on top the surface of die. The terminal pads are formed on the same surface to the dice active surface.

The dice placement process is the same as the current process. Elastic core paste (resin, epoxy compound, silicone rubber, etc.) is refilled the space between the dice edge and the sidewall of the through holes for thermal stress releasing buffer in the present invention, then, vacuum heat curing is applied. CTE mismatching issue is overcome during panel form process (using the base with lower CTE that close to silicon die) and the deepness between die and substrate FR5/BT is same level, the surface level of die (active surface side) and substrate can be the same after the die and substrate are attached on the base, and separated the panel wafer from the die redistribution tool. Only silicone dielectric material (preferably SINR) is coated on the active surface and the substrate (preferably FR45 or BT) surface. The contact pads are opened by using photo mask process only due to the dielectric layer (SINR) is photosensitive layer for opening the contacting open. The die attached material is printed on the back-side of dice and substrate be bonded together with base. The reliability for both package and board level is better than ever, especially, for the board level temperature cycling test, it was due to the CTE of substrate and PCB mother board are identical, hence, no thermal mechanical stress be applied on the solder bumps/balls; the previous failure mode (solder ball crack) during temperature cycling on board test were not obvious. The cost is low and the process is simple. It is easy to form the multi-chips package too.

Although preferred embodiments of the present invention have been described, it will be understood by those skilled in the art that the present invention should not be limited to the described preferred embodiments. Rather, various changes and modifications can be made within the spirit and scope of the present invention, as defined by the following Claims.

What is claimed is:

1. A structure of semiconductor device package comprising:
    a substrate with a die receiving through hole and contact metal pads;
    a base attached on a lower surface of said substrate;
    a die disposed within said die receiving through hole and attached on said base;
    an elastic core paste material filling a space (gap) between the die edge and sidewall of through hole of said substrate
    a dielectric layer formed on said die and said substrate;
    a re-distribution layer (RDL) formed on said dielectric layer and coupled to said die;
    a protection layer formed over said RDL; and
    pluralities of terminal pads formed on said protection layer and coupled to said RDL.

2. The structure of claim 1, further comprising conductive bumps coupled to said pluralities of terminal pads.

3. The structure of claim 1, wherein said RDL is made from an alloy comprising Ti/Cu/Au alloy or Ti/Cu/Ni/Au alloy.

4. The structure of claim 1, wherein the material of said substrate includes epoxy type FR5 or FR4.

5. The structure of claim 1, wherein the material of said substrate includes CCL (copper clad laminate), BT, silicon, PCB (print circuit board) material, glass or ceramic.

6. The structure of claim 1, wherein the material of said substrate includes alloy or metal.

7. The structure of claim 1, further includes a cover layer formed under said base.

8. The structure of claim 1, wherein the material of said dielectric layer includes an elastic dielectric layer, a photosensitive layer, a silicone dielectric based layer, a siloxane polymer (SINR) layer, a polyimides (PI) layer or silicone resin layer.

9. The structure of claim 1, wherein the material of said base includes Alloy42 (42% Ni-58% Fe), silicon, glass, ceramic or Kovar (29% Ni-17% Co-54% Fe).

* * * * *